(12) United States Patent
Kita

(10) Patent No.: US 11,852,693 B2
(45) Date of Patent: Dec. 26, 2023

(54) CABLE DETERIORATION DIAGNOSIS DEVICE, CABLE DETERIORATION DIAGNOSIS METHOD, AND PROGRAM

(71) Applicant: KABUSHIKI KAISHA YASKAWA DENKI, Fukuoka (JP)

(72) Inventor: Hiroyuki Kita, Fukuoka (JP)

(73) Assignee: KABUSHIKI KAISHA YASKAWA DENKI, Fukuoka (JP)

( * ) Notice: Subject to any disclaimer, the term of this patent is extended or adjusted under 35 U.S.C. 154(b) by 0 days.

(21) Appl. No.: 17/812,811

(22) Filed: Jul. 15, 2022

(65) Prior Publication Data

US 2023/0028876 A1    Jan. 26, 2023

(30) Foreign Application Priority Data

Jul. 21, 2021    (JP) .................................. 2021-120692

(51) Int. Cl.
*G01R 31/58* (2020.01)
*G01R 31/08* (2020.01)

(52) U.S. Cl.
CPC ........... *G01R 31/58* (2020.01); *G01R 31/088* (2013.01)

(58) Field of Classification Search
CPC ...... G01R 31/58; G01R 31/088; G01R 31/08; G01R 31/52; G01R 31/54
See application file for complete search history.

(56) References Cited

U.S. PATENT DOCUMENTS

2018/0337530 A1* 11/2018 Gariboldi ............... G01R 31/58

FOREIGN PATENT DOCUMENTS

| JP | 2002078130 A | 3/2002 |
| JP | 2007121102 A | 5/2007 |

OTHER PUBLICATIONS

Extended European Search Report dated Dec. 15, 2022, for EP Application No. 22186127.1.

* cited by examiner

*Primary Examiner* — Farhana A Hoque
(74) *Attorney, Agent, or Firm* — Colson Law Group, PLLC

(57) ABSTRACT

A cable deterioration diagnosis device configured to diagnose deterioration of a cable having a plurality of electrical wires including one or more signal wires configured to transmit signals between a first device and a second device, and includes a test signal output unit configured to output a wave-like test signal to a test signal transmitting wire independent of the one or more signal wires among the plurality of electrical wires, a test signal extraction unit configured to extract a received test signal corresponding to the test signal from a signal propagated in a test signal receiving wire independent of the one or more signal wires and the test signal transmitting wire among the plurality of electrical wires, and a deterioration detection unit configured to detect the deterioration of the cable based on the test signal and the received test signal.

13 Claims, 8 Drawing Sheets

CABLE DETERIORATION DIAGNOSIS DEVICE, CABLE DETERIORATION DIAGNOSIS METHOD, AND PROGRAM

CROSS-REFERENCE TO RELATED APPLICATIONS

This application claims priority pursuant to 35 U.S.C. 119(a) to Japan Patent Application No. 2021-120692, filed Jul. 21, 2022, which application is incorporated herein by reference in its entirety.

TECHNICAL FIELD

The present disclosure relates to a cable deterioration diagnosis device, a cable deterioration diagnosis method, and a program.

BACKGROUND ART

Patent Document 1 describes an electrical wire/cable disconnection detection method for injecting a high-frequency pulse into an electrical wire or a conductor in a cable, measuring a waveform that reflects this injected high-frequency pulse from the electrical wire or the cable as a reflected pulse, and detecting a disconnection of the wire or the conductor in the electrical cable based on this waveform.

PATENT LITERATURE

Patent Document 1: JP 2007-121102 A

SUMMARY

The present disclosure provides a device effective in detecting cable deterioration with a simpler configuration. A cable deterioration diagnosis device according to one aspect of the present disclosure is a device configured to diagnose deterioration of a cable having a plurality of electrical wires including one or more signal wires configured to transmit signals between a first device and a second device, and includes a test signal output unit configured to output a test signal having a wavelike shape to a test signal transmitting wire independent of the one or more signal wires among the plurality of electrical wires, a test signal extraction unit configured to extract a received test signal corresponding to the test signal from a signal propagated in a test signal receiving wire independent of the one or more signal wires and the test signal transmitting wire among the plurality of electrical wires, and a deterioration detection unit configured to detect deterioration of the cable based on the test signal and the received test signal.

A cable deterioration diagnosis method according to another aspect of the present disclosure is a method of diagnosing deterioration of a cable having a plurality of electrical wires including one or more signal wires configured to transmit signals between a first device and a second device, and includes outputting a test signal having a wavelike shape to a test signal transmitting wire independent of the one or more signal wires among the plurality of electrical wires, extracting a received test signal corresponding to the test signal from a signal propagated in a test signal receiving wire independent of the one or more signal wires and the test signal transmitting wire among the plurality of electrical wires, and detecting deterioration of the cable based on the test signal and the received test signal.

A program according to still another aspect of the present disclosure causes a device to execute a method of diagnosing deterioration of a cable having a plurality of electrical wires including one or more signal wires configured to transmit signals between a first device and a second device. The method includes outputting a test signal having a wavelike shape to a test signal transmitting wire independent of the one or more signal wires among the plurality of electrical wires, extracting a received test signal corresponding to the test signal from a signal propagated in a test signal receiving wire independent of the one or more signal wires and the test signal transmitting wire among the plurality of electrical wires, and detecting deterioration of the cable based on the test signal and the received test signal.

According to the present disclosure, it is possible to provide a device effective in detecting cable deterioration with a simpler configuration.

DETAILED DESCRIPTION OF DRAWINGS

An embodiment will be described in detail below with reference to the drawings. In the description, elements which are the same or have the same function are given the same reference numbers, and redundant descriptions thereof are omitted.

Figure 1:
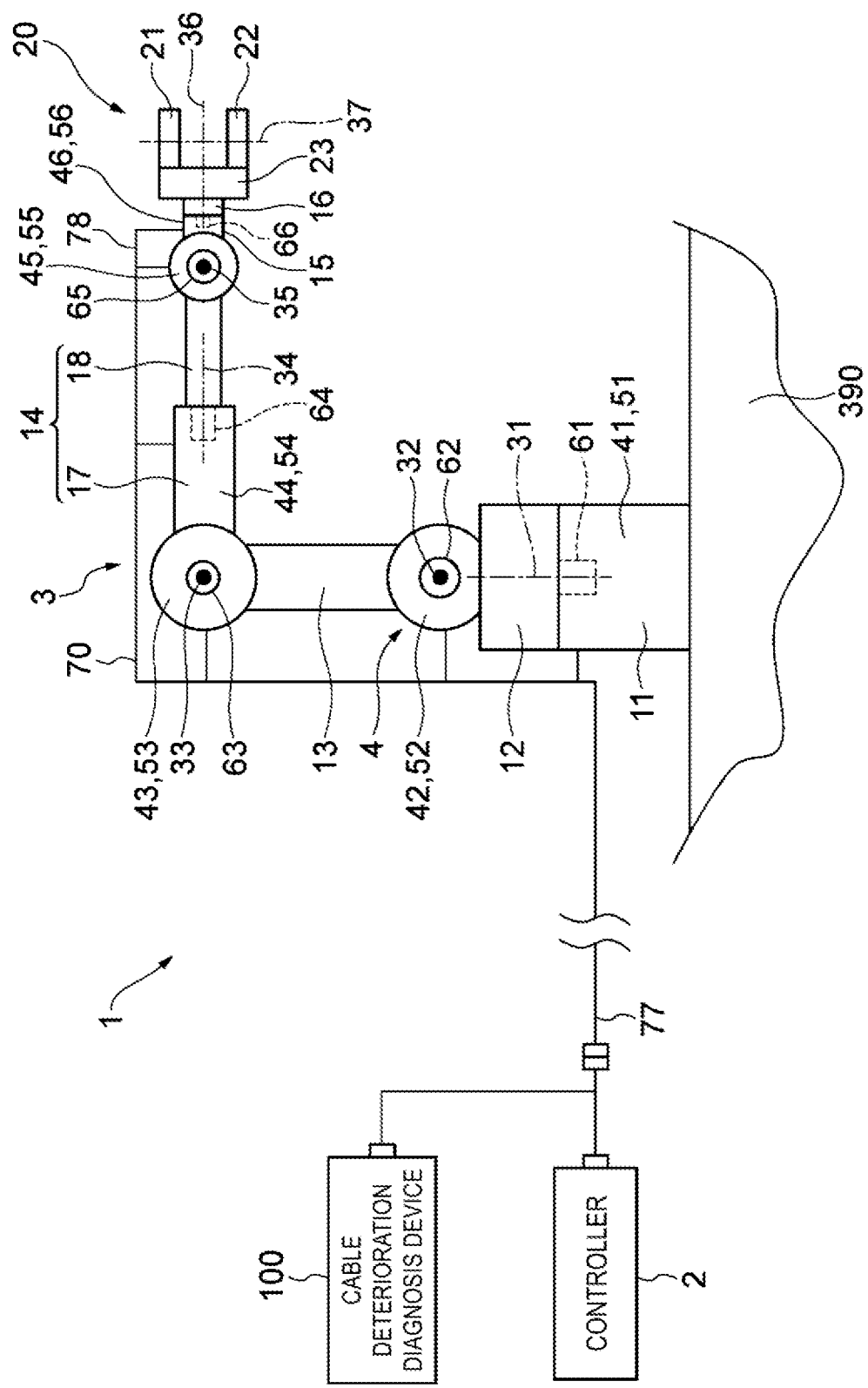
FIG. 1 is a schematic view illustrating a configuration of a machine system.

A machine system 1 illustrated in FIG. 1 includes a first device 2, a second device 3, a cable 70 that connects the first device 2 and the second device 3, and a cable deterioration diagnosis device 100 that diagnoses a deterioration state of the cable 70.

The second device 3 is a device having a movable unit 4 that operates while bending the cable 70, and the first device 2 is a controller that controls the second device 3. An example of the second device 3 is a robot. The robot has a plurality of joints as the movable unit 4.

The second device 3 illustrated in FIG. 1 is an industrial vertical articulated robot, and has a base 11, a rotation section 12, a first arm 13, a second arm 14, a wrist 15, a tip 16, joints 41, 42, 43, 44, 45, and 46, actuators 51, 52, 53, 54, 55, and 56, and a sensor 61, a sensor 62, a sensor 63, a sensor 64, a sensor 65, and a sensor 66.

The base 11 is installed on a floor or the like in a work area. The rotation section 12 is mounted on the base 11 so as to be rotatable around a vertical axis 31. For example, the second device 3 has the joint 41 that attaches the rotation section 12 to the base 11 so as to be rotatable around the axis 31. The first arm 13 is connected to the rotation section 12 so as to be rotatable around an axis 32 that intersects (e.g., is orthogonal to) the axis 31. For example, the second device 3 has the joint 42 that connects the first arm 13 to the rotation section 12 so as to be rotatable around the axis 32. The term "intersect" includes in its meaning a twisted relationship such as a so-called three-dimensional intersection. The same applies hereinafter. The first arm 13 extends from the rotation section 12 along one direction that intersects (e.g., is orthogonal to) the axis 32.

The second arm 14 is connected to an end of the first arm 13 so as to be rotatable around an axis 33 parallel to the axis 32. For example, the second device 3 has the joint 43 that connects the second arm 14 to the first arm 13 so as to be rotatable around the axis 33. The second arm 14 has an arm base 17 extending from an end of the first arm 13 along one direction that intersects (e.g., is orthogonal to) the axis 33, and an arm end 18 further extending from an end of the arm base 17 along the same one direction. The arm end 18 is rotatable around an axis 34 to the arm base 17. The axis 34 intersects (e.g., is orthogonal to) the axis 33. For example, the second device 3 has the joint 44 that connects the arm end 18 to the arm base 17 so as to be rotatable around the axis 34.

The wrist 15 is connected to an end of the arm end 18 so as to be rotatable around an axis 35 that intersects (e.g., is orthogonal to) the axis 34. For example, the second device 3 has the joint 45 that connects the wrist 15 to the arm end 18 so as to be rotatable around the axis 35. The wrist 15 extends from the end of the arm end 18 along one direction that intersects (e.g., is orthogonal to) the axis 35. The tip 16 is connected to an end of the wrist 15 so as to be rotatable around an axis 36 that intersects (e.g., is orthogonal to) the axis 35. For example, the second device 3 has the joint 46 that connects the tip 16 to the wrist 15 so as to be rotatable around the axis 36.

The actuators 51, 52, 53, 54, 55, and 56 drive the joints 41, 42, 43, 44, 45, and 46, respectively. The actuators 51, 52, 53, 54, 55, and 56 include, for example, electric motors and transmission units (e.g., reduction gears) that transmit power of the electric motors to the joints 41, 42, 43, 44, 45, and 46, respectively. For example, the actuator 51 drives the joint 41 so as to rotate the rotation section 12 around the axis 31. The actuator 52 drives the joint 42 so as to rotate the first arm 13 around the axis 32. The actuator 53 drives the joint 43 so as to rotate the second arm 14 around the axis 33. The actuator 54 drives the joint 44 so as to rotate the arm end 18 around the axis 34. The actuator 55 drives the joint 45 so as to rotate the wrist 15 around the axis 35. The actuator 56 drives the joint 46 so as to rotate the tip 16 around the axis 36.

The sensor 61, the sensor 62, the sensor 63, the sensor 64, the sensor 65, and the sensor 66 detect rotation angles of the joints 41, 42, 43, 44, 45, and 46 (or the rotation angles of the rotors of the actuators 51, 52, 53, 54, 55, and 56), respectively. For example, the sensor 61 detects a rotation angle of the rotation section 12 to the base 11, the sensor 62 detects a rotation angle of the first arm 13 to the rotation section 12, the sensor 63 detects a rotation angle of the second arm 14 to the first arm 13, the sensor 64 detects a rotation angle of the arm end 18 to the arm base 17, the sensor 65 detects a rotation angle of the wrist 15 to the arm end 18, and the sensor 66 detects a rotation angle of the tip 16 to the wrist 15. For example, each of the sensor 61, the sensor 62, the sensor 63, the sensor 64, the sensor 65, and the sensor 66 is a rotary encoder, which detects an operating angle of the corresponding joint or the rotor of the actuator based on a signal corresponding to the rotation angle of the corresponding joint or the rotor of the actuator. The sensor 61, the sensor 62, the sensor 63, the sensor 64, the sensor 65, and the sensor 66 transmit digital signals representing the detection results of the operating angles to the first device 2 via the cable 70. For example, the sensor 61, the sensor 62, the sensor 63, the sensor 64, the sensor 65, and the sensor 66 transmit the digital signals to the first device 2 via serial communication.

The first device 2 controls the second device 3 based on a predetermined operation program. The operation program includes a plurality of operation commands in time series. Each of the plurality of operation commands includes at least commands for a position, a posture, and a movement speed of the tip 16. The first device 2 repeats a control cycle including at least the following processes in a predetermined cycle:

Process 1) Calculate a target position and a target posture of the tip 16 based on the operation command.

Process 2) Calculate target angles of the joints 41, 42, 43, 44, 45, and 46 by performing inverse motion operations for the target position and the target posture of the tip 16.

Process 3) Control the actuators 51, 52, 53, 54, 55, and 56 so that the operating angles of the joints 41, 42, 43, 44, 45, and 46 follow the target angles based on the operating angles of the joints 41, 42, 43, 44, 45, and 46 received from the sensor 61, the sensor 62, the sensor 63, the sensor 64, the sensor 65, and the sensor 66.

Figure 2:
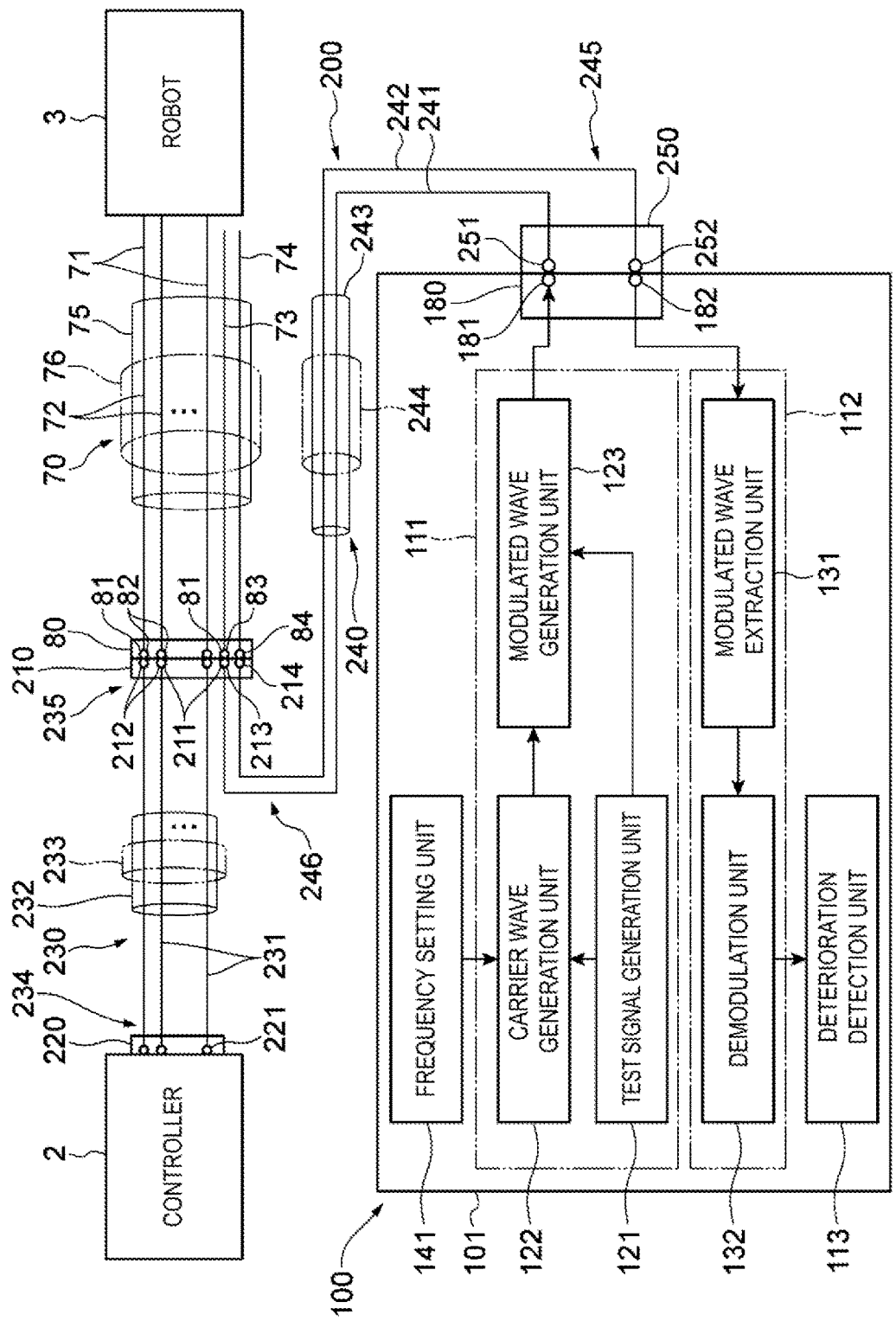
FIG. 2 is a block diagram illustrating a functional configuration of a cable deterioration diagnosis device.

The cable 70 has a first end 77 connected to the first device 2 and a second end 78 connected to the second device 3, and transmits one or more signals between the first device 2 and the second device 3. As illustrated in FIG. 2, the cable 70 includes a plurality of electrical wires 71, a shield wire 75, an insulating sheath 76, and a connector 80. The plurality of electrical wires 71 include one or more signal wires 72, a test signal transmitting wire 73, and a test signal receiving wire 74. Each of the plurality of electrical wires 71 is covered with an insulating individual sheath and is insulated from other electrical wires 71. Thus, the test signal transmitting wire 73 is independent of the one or more signal wires 72, and the test signal receiving wire 74 is independent of the one or more signal wires 72 and the test signal transmitting wire 73.

The one or more signal wires 72 transmit the one or more signals between the first device 2 and the second device 3, respectively. When transmitting the plurality of signals between the first device 2 and the second device 3, the plurality of electrical wires 71 have a plurality of signal wires 72 each corresponding to the plurality of signals. Examples of the plurality of signals include a plurality of digital signals transmitted by the sensor 61, the sensor 62, the sensor 63, the sensor 64, the sensor 65, and the sensor 66, respectively. The plurality of electrical wires 71 may have a plurality of pairs of signal wires 72 each corresponding to the plurality of signals. Each of the plurality of pairs constitutes, for example, a twisted pair, and transmits the corresponding signal as a differential signal. The test signal transmitting wire 73 and the test signal receiving wire 74 are electrically connected to the cable deterioration diagnosis device 100 at the first end 77. The test signal transmitting wire 73 and the test signal receiving wire 74 are not connected to the second device 3 at the second end 78, and are released in a state of being isolated from the surroundings.

The shield wire 75 is a net-like conductive member woven so as to cover the plurality of electrical wires 71. The insulating sheath 76 is an insulating tube formed so as to cover the shield wire 75.

The connector 80 is provided at the first end 77, and has a plurality of conductive terminals 81. The plurality of terminals 81 include one or more signal terminals 82, a test signal transmitting terminal 83, and a test signal receiving terminal 84. The one or more signal terminals 82 are connected to the one or more signal wires 72, respectively. The test signal transmitting terminal 83 is connected to the test signal transmitting wire 73. The test signal receiving terminal 84 is connected to the test signal receiving wire 74. When the plurality of electrical wires 71 include the plurality of pairs of signal wires 72, the plurality of terminals 81 include a plurality of pairs of signal terminals 82, each corresponding to the plurality of pairs of signal wires 72.

The cable deterioration diagnosis device 100 diagnoses the deterioration of the cable 70. The term "deterioration" means occurrence of a change in electrical conductivity, imbalance, or the like in the cable 70 due to damage. Examples of changes in electrical properties include changes in the electrical resistance and inductance of the individual electrical wires 71 and changes in capacitance between two or more electrical wires 71. The electrical properties do not substantially change even when the undamaged cable 70 is subjected to a movement such as bending, stretching and the like. On the other hand, damage to the cable 70 causes changes in electrical properties. Further, the electrical properties of the cable 70 are further changed by applying a movement such as bending and stretching to the damaged portion. Examples of damage to the cable 70 include partial or complete disconnection of a conductive core wire of the electrical wire 71, and thinning of the individual sheath for the electrical wire 71 or the like. The disconnection of the core wire and the thinning of the individual sheath may be caused by repetitive stresses such as bending, stretching and the like due to the operation of the second device 3. Further, the disconnection of the core wire and the thinning of the individual sheath may also be caused by a sudden stress, such as pinching of the cable 70.

In order to detect deterioration of the one or more signal wires 72, it is conceivable to apply test signals to the one or more signal wires 72 themselves, and check responses. However, according to a method of applying the test signals to the one or more signal wires 72 themselves, it is necessary to apply a test signal to each of the plurality of signal wires 72 when the cable 70 has the plurality of signal wires 72. In contrast, the cable deterioration diagnosis device 100 is configured to output a wave-like test signal to the test signal transmitting wire 73, extract the received test signal corresponding to the test signal from the signal propagated in the test signal receiving wire 74, and detect the deterioration of the cable 70 based on the test signal and the received test signal.

Thus, the deterioration of the cable 70 can be detected based on the test signal output to the single test signal transmitting wire 73 and the received test signal propagated in the single test signal receiving wire 74 regardless of the number of signal wires 72. Therefore, it is effective in detecting the deterioration of the cable 70 with a simpler configuration.

For example, the cable deterioration diagnosis device 100 includes a main body 101 and an adapter 200. The cable deterioration diagnosis device 100 includes a main body 101 and an adapter 200. The main body 101 has a test signal output unit 111, a test signal extraction unit 112, and a deterioration detection unit 113 as functional configurations (hereinafter, referred to as "functional blocks").

The test signal output unit 111 outputs a wave-like test signal to the test signal transmitting wire 73. For example, the test signal output unit 111 outputs a test signal modulated wave, in which the test signal is superimposed on a carrier wave, to the test signal transmitting wire 73.

For example, the test signal output unit 111 has a test signal generation unit 121, a carrier wave generation unit 122, and a modulated wave generation unit 123 as functional blocks. The test signal generation unit 121 generates a wave-like test signal. The waveform of the test signal is not particularly limited. For example, the test signal generation unit 121 may generate a square wave test signal, a sawtooth wave test signal, or a sine wave test signal. The carrier wave generation unit 122 generates a carrier wave. The waveform of the carrier wave is also not limited particularly limited. For example, the carrier wave generation unit 122 may generate a square wave test signal, a sawtooth wave test signal, or a sine wave test signal. The modulated wave generation unit 123 generates a test signal modulated wave in which the test signal generated by the test signal generation unit 121 is superimposed on the carrier wave generated by the carrier wave generation unit 122, and outputs the test signal modulated wave to the test signal transmitting wire 73.

For example, the modulated wave generation unit 123 generates a frequency modulation (FM) modulated wave in which a frequency of the carrier wave is modulated by the test signal, as a test signal modulated wave. The modulated wave generation unit 123 may generate an amplitude modulation (AM) modulated wave in which an amplitude of the carrier wave is modulated by the test signal, as a test signal modulated wave. The modulated wave generation unit 123 may generate a phase modulation (PM) modulated wave in which a phase of the carrier wave is modulated by the test signal, as a test signal modulated wave.

The test signal extraction unit 112 extracts the received test signal corresponding to the test signal from the signal propagated in the test signal receiving wire 74. For example, the test signal extraction unit 112 extracts a test signal received wave corresponding to the test signal modulated wave from the signal propagated in the test signal receiving wire 74, and extracts the received test signal from the test signal received wave.

For example, the test signal extraction unit 112 has a modulated wave extraction unit 131 and a demodulation unit 132 as functional blocks. The modulated wave extraction unit 131 extracts the test signal received wave corresponding to the test signal modulated wave from the signal propagated in the test signal receiving wire 74. For example, the modulated wave extraction unit 131 extracts the test signal received wave by a bandpass filter corresponding to a frequency band of the test signal modulated wave. The demodulation unit 132 applies demodulation processing corresponding to the modulation processing for generating the test signal modulated wave to the test signal received wave to extract the received test signal.

The deterioration detection unit 113 detects the deterioration of the cable 70 based on the test signal and the received test signal. For example, the deterioration detection unit 113 detects the deterioration of the cable 70 based on a fluctuation in the difference between intensity (e.g., amplitude) of the test signal and intensity (e.g., amplitude) of the received test signal.

For example, the deterioration detection unit 113 detects the deterioration of the cable 70 when the amount of fluctuation in the difference between the intensity (e.g., amplitude) of the test signal and the intensity (e.g., amplitude) of the received test signal exceeds a predetermined deterioration detection level. When the amount of fluctuation does not reach the deterioration detection level, the deterioration detection unit 113 does not detect deterioration of the cable 70 (detects no deterioration in the cable 70).

The test signal output unit 111 may output a test signal modulated wave to the test signal transmitting wire 73, in which the test signal is superimposed on a carrier wave having a frequency different from a frequency of the signals transmitted by the one or more signal wires 72. For example, the carrier wave generation unit 122 generates the carrier wave having the frequency different from the frequency of the signal transmitted by each of the plurality of signal wires 72.

In this case, the magnitude of the frequency of the carrier wave depends on a diameter of the cable and the frequency of the signal transmitted by each of the plurality of signal wires 72. Thus, the cable deterioration diagnosis device 100 may be configured so that the frequency of the carrier wave can be changed. For example, the main body 101 further has a frequency setting unit 141 as a functional block. The frequency setting unit 141 sets the frequency of the carrier wave based on an operation input by an operator (e.g., an input to an input device 199 described later). The carrier wave generation unit 122 generates a carrier wave with the frequency set by the frequency setting unit 141. According to this configuration, the frequency of the carrier wave can be changed by the operation input.

To electrically connect the test signal transmitting wire 73 and the test signal receiving wire 74, the main body 101 further has a connector 180. The connector 180 has a conductive test signal transmitting terminal 181 and a conductive test signal receiving terminal 182. The test signal transmitting terminal 181 is electrically connected to the test signal transmitting wire 73, and the test signal receiving terminal 182 is electrically connected to the test signal receiving wire 74. The modulated wave generation unit 123 outputs the test signal modulated wave to the test signal transmitting terminal 181, and the modulated wave extraction unit 131 acquires the signal propagated in the test signal receiving wire 74 from the test signal receiving terminal 182.

The adapter 200 connects the one or more signal wires 72 to the first device 2 and connects the test signal transmitting wire 73 and the test signal receiving wire 74 to the main body 101. The adapter 200 has a first connector 210, a main cable 230, a second connector 220, a branch cable 240, and a third connector 250.

The first connector 210 is connected to the connector 80. The first connector 210 has a plurality of conductive terminals 211. The plurality of terminals 211 each come into contact with the plurality of terminals 81 of the connector 80. The plurality of terminals 211 includes one or more signal terminals 212 that each come into contact with the one or more signal terminals 82, a test signal transmitting terminal 213 that comes into contact with the test signal transmitting terminal 83, and a test signal receiving terminal 214 that comes into contact with the test signal receiving terminal 84.

The main cable 230 has a first end 234 connected to the first device 2 and a second end 235 connected to the cable 70. The main cable 230 has one or more signal wires 231, a shield wire 232, and a cable sheath 233. Each of the one or more signal wires 231, the shield wire 232, and the cable sheath 233 is covered with an insulating individual sheath and is insulated from other electrical wires. The shield wire 232 is a net-like conductive member woven so as to cover the one or more signal wires 231. The cable sheath 233 is an insulating tube formed so as to cover the shield wire 232.

The second end 235 is connected to the first connector 210. In the first connector 210, the one or more signal wires 231 are connected to the one or more signal terminals 212, respectively. The second connector 220 is provided at the first end 234. The second connector 220 has one or more conductive signal terminals 221. In the second connector 220, the one or more signal wires 231 are connected to the one or more signal terminals 221, respectively. The second connector 220 is connected to the first device 2. Each of the one or more signal terminals 221 is electrically connected to a control circuit of the first device 2. In this way, the one or more signal wires 72 are connected to the first device 2 via the one or more signal wires 231 of the main cable 230.

The branch cable 240 has a first end 245 connected to the main body 101 and a second end 246 connected to the cable 70. The branch cable 240 has a test signal transmitting wire 241, a test signal receiving wire 242, a shield wire 243, and a cable sheath 244. The test signal transmitting wire 241 and the test signal receiving wire 242 are each covered with insulating individual sheaths and are insulated from each other. The shield wire 243 is a net-like conductive member woven so as to cover the test signal transmitting wire 241 and the test signal receiving wire 242. The cable sheath 244 is an insulating tube formed so as to cover the shield wire 243. The second end 246 is connected to the first connector 210. In the first connector 210, the test signal transmitting wire 241 is connected to the test signal transmitting terminal 213, and the test signal receiving wire 242 is connected to the test signal receiving terminal 214.

The third connector 250 is provided at the first end 245. The third connector 250 has a conductive test signal transmitting terminal 251 and a conductive test signal receiving terminal 252. In the third connector 250, the test signal transmitting wire 241 is connected to the test signal transmitting terminal 251, and the test signal receiving wire 242 is connected to the test signal receiving terminal 252. The third connector 250 is connected to the connector 180 of the main body 101. The test signal transmitting terminal 251 comes into contact with the test signal transmitting terminal 181, and the test signal receiving terminal 252 comes into contact with the test signal receiving terminal 182. Thus, the test signal transmitting wire 73 and the test signal receiving wire 74 are connected to the main body 101 via the test signal transmitting wire 241 and the test signal receiving wire 242 of the branch cable 240.

The cable deterioration diagnosis device 100 may be configured to calculate an estimated value of a residual life representing a length of a period of time until the deterioration level of the cable 70 exceeds an acceptable level, based on a frequency at which the amount of fluctuation exceeds the deterioration detection level. The term "frequency" is, for example, the number of occurrences per unit time.

Figure 3:
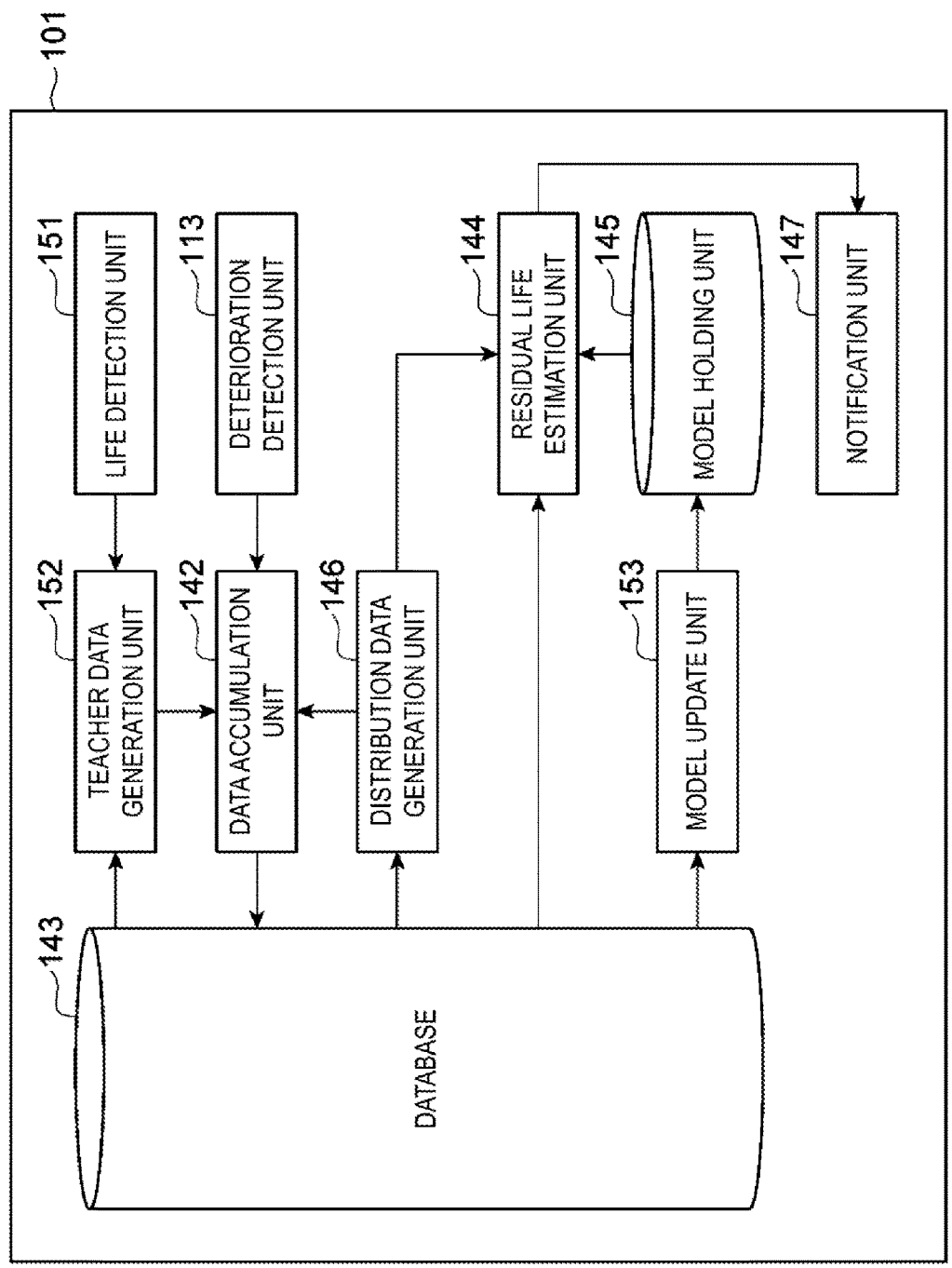
FIG. 3 is a block diagram illustrating a functional configuration of the cable deterioration diagnosis device.

For example, as illustrated in FIG. 3, the main body 101 further has a data accumulation unit 142, a database 143, a model holding unit 145, and a residual life estimation unit 144 as functional blocks. Each time the amount of fluctuation exceeds the deterioration detection level, the data accumulation unit 142 accumulates, in the database 143, a fluctuation record in which a value of the amount of fluctuation is associated with a time. The model holding unit 145 stores a life prediction model. The life prediction model outputs the estimated value of the residual life in response to the input of the data including the frequency.

Figure 4:
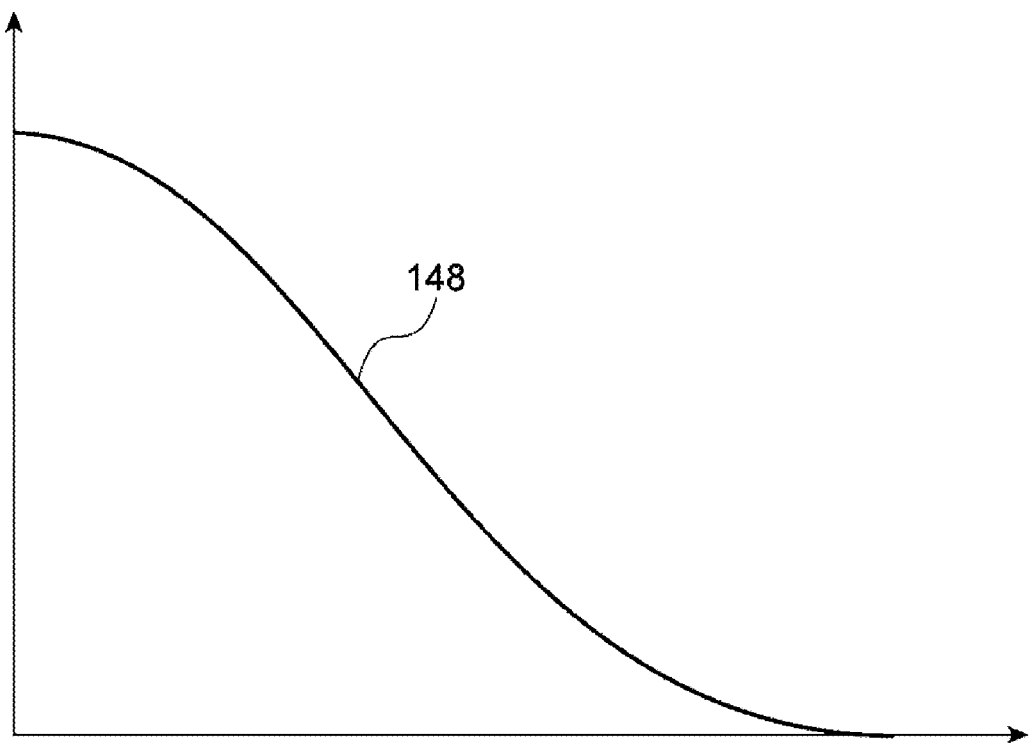
FIG. 4 is a graph illustrating a life prediction model.

FIG. 4 is a graph illustrating the life prediction model. In FIG. 4, the horizontal axis represents the frequency, and the vertical axis represents the estimated value of the residual life. The life prediction model 148, which is indicated by a solid line in FIG. 4, is defined by, for example, a single variable function or the like so as to output the estimated value of the residual life in response to the input of the frequency.

Returning to FIG. 3, the residual life estimation unit 144 calculates the estimated value of the residual life based on the frequency at which the amount of fluctuation exceeds the deterioration detection level. For example, the residual life estimation unit 144 calculates the frequency at which the amount of fluctuation exceeds the deterioration detection level based on the fluctuation records accumulated in the database 143. The residual life estimation unit 144 inputs the calculated frequency to the life prediction model 148 to calculate the estimated value of the residual life.

The cable deterioration diagnosis device 100 may be configured to calculate the estimated value of the residual life based on the amount of fluctuation. For example, the life prediction model 148 stored in the model holding unit 145 may be configured to output the estimated value of the residual life in response to an input of data including the amount of fluctuation. For example, the life prediction model 148 may be defined by, for example, a single variable function so as to output the estimated value of the residual life in response to an input of the amount of fluctuation. The residual life estimation unit 144 inputs the amount of fluctuation included in the latest fluctuation record into the life prediction model 148 to calculate the estimated value of the residual life.

The cable deterioration diagnosis device 100 may be configured to calculate the estimated value of the residual life based on the amount of fluctuation and the frequency. For example, the life prediction model 148 stored in the model holding unit 145 may be configured to output the estimated value of the residual life in response to an input of data including the amount of fluctuation and the frequency. For example, the life prediction model 148 may be defined by, for example, a two-variable function so as to output the estimated value of the residual life in response to inputs of the amount of fluctuation and the frequency. The residual life estimation unit 144 calculates the frequency at which the amount of fluctuation exceeds the deterioration detection level based on the fluctuation records accumulated in the database 143. The residual life estimation unit 144 inputs the calculated frequency and the amount of fluctuation included in the latest fluctuation record into the life prediction model 148 to calculate the estimated value of the residual life.

The cable deterioration diagnosis device 100 may be configured to calculate the estimated value of the residual life based on frequency distribution data representing the frequency of the amount of fluctuation for each of a plurality of bands. For example, the main body 101 further has a distribution data generation unit 146 as a functional block. The distribution data generation unit 146 generates frequency distribution data representing the frequency for each of the plurality of bands based on the fluctuation records accumulated in the database 143.

For example, the distribution data generation unit 146 generates frequency distribution data (e.g., a frequency distribution table) that represents the frequency for each of the plurality of bands obtained by dividing the magnitude of the amount of fluctuation by a plurality of boundary values arranged at equal distances. The life prediction model 148 stored in the model holding unit 145 may be configured to output the estimated value of the residual life in response to an input of the frequency distribution data. Examples of the life prediction model 148 include neural networks, self-organizing maps and the like constructed by machine learning. The residual life estimation unit 144 calculates the estimated value of the residual life based on the frequency distribution data generated by the distribution data generation unit 146 and the life prediction model 148. For example, the residual life estimation unit 144 inputs the frequency distribution data generated by the distribution data generation unit 146 into the life prediction model 148 to calculate the estimated value of the residual life.

The cable deterioration diagnosis device 100 may be configured to calculate the estimated value of the residual life based on two or more frequency distribution data in time series. For example, the distribution data generation unit 146 repeatedly generates frequency distribution data each time a predetermined number of fluctuation records are added to the database 143. The predetermined number may be one or two or more. The data accumulation unit 142 accumulates the frequency distribution data generated repeatedly by the distribution data generation unit 146 in the database 143 in time series. For example, the data accumulation unit 142 accumulates frequency distribution data in the database 143 in association with a time (e.g., the time of generation of the frequency distribution data).

Figure 5:
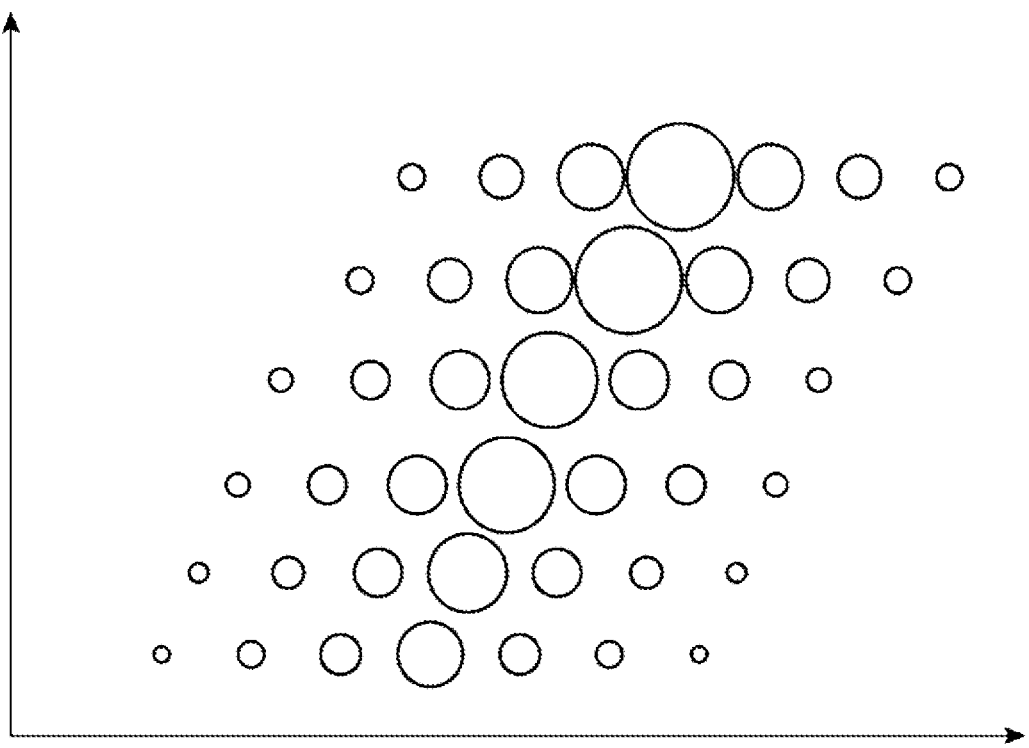
FIG. 5 is a schematic diagram illustrating map data.

The life prediction model 148 stored in the model holding unit 145 may be configured to output the estimated value of the residual life in response to inputs of two or more frequency distribution data in time series. The residual life estimation unit 144 calculates the estimated value of the residual life based on the two or more frequency distribution data in time series accumulated in the database 143 and the life prediction model 148. For example, the residual life estimation unit 144 inputs the two or more frequency distribution data in time series accumulated in the database 143 into the life prediction model 148 to calculate the estimated value of the residual life. FIG. 5 is a graph illustrating two or more frequency distribution data input to the life prediction model 148. In FIG. 5, the horizontal axis represents the amount of fluctuation, and the vertical axis represents the elapsed time. A plurality of circles aligned in the horizontal row are one set of frequency distribution data. The size of each of the plurality of circles represents the frequency. The graph in FIG. 5 contains six sets of frequency distribution data in time series.

Returning to FIG. 3, the cable deterioration diagnosis device 100 may be configured to notify that the estimated value of the residual life has reached a predetermined notification level. For example, the main body 101 further has a notification unit 147 as a functional block. The notification unit 147 displays a warning indication on a display device 198 or the like described later, for notifying that the estimated value of the residual life calculated by the residual life estimation unit 144 drops until the estimated value of the residual life reaches a predetermined notification level. For example, the notification unit 147 compares the estimated value of the residual life calculated by the residual life estimation unit 144 with the notification level, and displays the warning indication on the display device 198 or the like when the estimated value of the residual life is below the notification level.

The cable deterioration diagnosis device 100 may be configured to update the life prediction model 148 based on data accumulated in the database 143 when the deterioration level exceeds an acceptable level. For example, the main body 101 further has a life detection unit 151, a teacher data generation unit 152, and a model update unit 153 as functional blocks.

The life detection unit 151 detects that the deterioration level exceeds the acceptable level. Hereinafter, the deterioration level exceeding the acceptable level is referred to as an "end of life of the cable 70". An example of the acceptable level is a level at which a communication failure due to the cable 70 is detected in the first device 2. In this case, the life detection unit 151 detects the end of life of the cable 70 when a signal indicating the occurrence of communication failure due to the cable 70 is acquired from the first device 2. The acceptable level may be a level at which the frequency at which the amount of fluctuation exceeds the deterioration detection level exceeds a predetermined upper limit value. In this case, the life detection unit 151 calculates the frequency based on the fluctuation records accumulated in the database 143, and detects the end of life of the cable 70 when the frequency exceeds the upper limit value. The acceptable level may be a level at which the amount of fluctuation exceeds a predetermined upper limit value. In this case, the life detection unit 151 detects the end of life of the cable 70 when the amount of fluctuation included in the latest fluctuation record exceeds the upper limit value. The life detection unit 151 may detect the end of life of the cable 70 based on the input to the input device 199 described later.

When the deterioration level exceeds the acceptable level, the teacher data generation unit 152 generates teacher data representing a relationship between the two or more frequency distribution data and the estimated value of the residual life based on the data accumulated in the database 143. For example, the teacher data generation unit 152 generates the teacher data based on the data accumulated in the database 143 when the end of life of the cable 70 is detected by the life detection unit 151. Hereinafter, the two or more frequency distribution data required for generating the teacher data are referred to as map data.

When the number of frequency distribution data accumulated in the database 143 is greater than the number of frequency distribution data in the map data, the teacher data generation unit 152 may generate two or more teacher data. When the number of frequency distribution data accumulated in the database 143 is greater than the number of frequency distribution data in the map data, the database 143 will contain two or more map data, including the latest frequency distribution data and the oldest frequency distribution data separately. The teacher data generation unit 152 generates a period up to the detection timing of the end of life of the cable 70 for each of the two or more map data by the generation timing of the latest frequency distribution data. Hereinafter, the period generated here is referred to as a "measured life period". The teacher data generation unit 152 generates two or more teacher data by mapping the measured life period to each of the two or more map data.

The data accumulation unit 142 accumulates the teacher data generated by the teacher data generation unit 152 in the database 143. The model update unit 153 updates the life prediction model 148 by machine learning based on the teacher data accumulated in the database 143, and stores the updated life prediction model 148 in the model holding unit 145.

Figure 6:
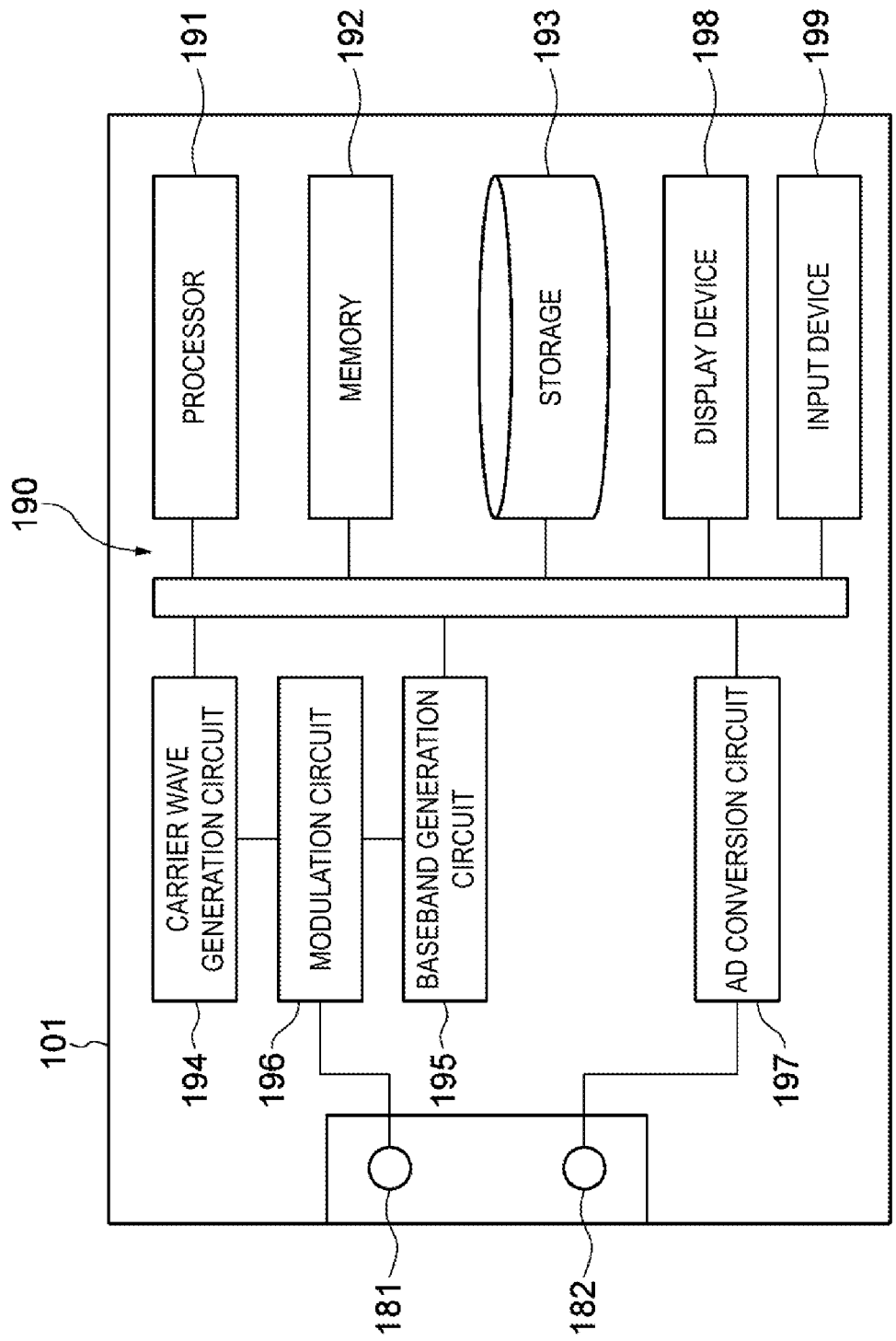
FIG. 6 is a block diagram illustrating a hardware configuration of the cable deterioration diagnosis device.

FIG. 6 is a block diagram illustrating a hardware configuration of the main body 101. As illustrated in FIG. 6, the main body 101 includes a circuit 190 and the connector 180. The circuit 190 has one or more processors 191, a memory 192, a storage 193, a carrier wave generation circuit 194, a baseband generation circuit 195, a modulation circuit 196, an AD conversion circuit 197, the display device 198, and the input device 199. The storage 193 stores a program for causing a device to execute a cable deterioration diagnosis method that includes outputting a wave-like test signal to the test signal transmitting wire 73, extracting a received test signal corresponding to the test signal from the signal propagated in the test signal receiving wire 74, and detecting deterioration of the cable 70 based on the test signal and the received test signal. For example, the storage 193 stores a program for configuring each of the above functional blocks in the cable deterioration diagnosis device 100.

The storage 193 includes a storage medium that stores the program. Examples of the storage medium include stationary media such as a hard disk, a non-volatile memory and the like, and portable media such as a USB memory, an optical disk, a magnetic disk and the like.

The memory 192 temporarily stores a program loaded from the storage 193. The one or more processors 191 configure each of the above functional blocks in the main body 101 by executing the program loaded into the memory 192. The data generated by the one or more processors 191 in the process of executing the program is stored in the memory 192 as appropriate.

The carrier wave generation circuit 194 generates the carrier wave at a frequency determined by the one or more processors 191. The baseband generation circuit 195 generates the test signal defined by the one or more processors 191. The modulation circuit 196 modulates the carrier wave generated by the carrier wave generation circuit 194 with the test signal generated by the baseband generation circuit 195 to generate the test signal modulated wave, and outputs the generated test signal modulated wave via the test signal transmitting terminal 181 of the connector 180 to the test signal transmitting wire 73.

The AD conversion circuit 197 acquires an analog signal from the test signal receiving wire 74 via the test signal receiving terminal 182 of the connector 180 and converts the acquired analog signal into a digital signal. By applying digital signal processing to the digital signal generated by the AD conversion circuit 197 with this conversion, the test signal received wave is extracted and the received test signal is extracted.

The display device 198 displays an image in response to a request from the one or more processors 191. Examples of the display device 198 include a liquid crystal monitor and the like. The input device 199 acquires an operation input by the operator and notifies one or more processors 191 of the content of the operation input. Examples of the input device 199 include a keyboard, a mouse and the like. The input device 199 may be integrated into the display device 198 as a so-called touch panel.

The hardware configuration described above is merely an example, and can be modified as appropriate. For example, at least any one of the functional blocks may be configured by dedicated circuitry such as an application specific integrated circuit (ASIC) instead of the general-purpose processor 191.

Next, as an example of a cable deterioration diagnosis method, a cable deterioration diagnosis procedure executed by the cable deterioration diagnosis device 100 will be illustrated. The procedure includes outputting a wave-like test signal to the test signal transmitting wire 73, extracting a received test signal corresponding to the test signal from the signal propagated in the test signal receiving wire 74, and detecting deterioration of the cable 70 based on the test signal and the received test signal.

Figure 7:
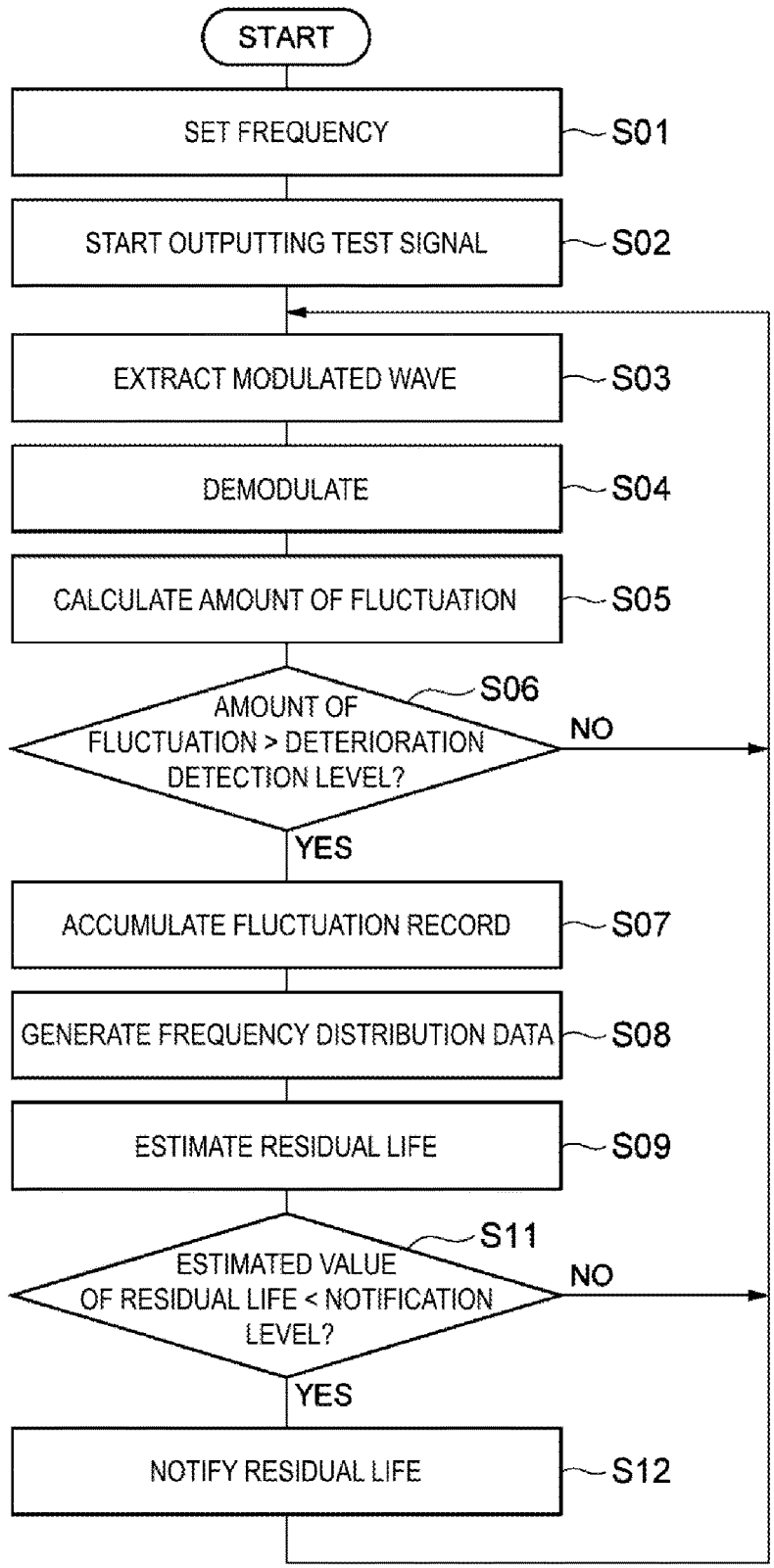
FIG. 7 is a flowchart illustrating a cable deterioration diagnosis procedure.

For example, as illustrated in FIG. 7, the cable deterioration diagnosis device 100 first executes steps S01 and S02. In step S01, the frequency setting unit 141 sets the frequency of the carrier wave based on the operation input by the operator.

In step S02, the test signal output unit 111 starts outputting the test signal. For example, the test signal generation unit 121 starts generating the test signal, the carrier wave generation unit 122 starts generating the carrier wave, and the modulated wave generation unit 123 starts generating the test signal modulated wave and outputting the generated test signal modulated wave to the test signal transmitting wire 73.

Subsequently, the cable deterioration diagnosis device 100 executes steps S03 and S04. In step S03, the modulated wave extraction unit 131 extracts the test signal received wave corresponding to the test signal modulated wave from the signal propagated in the test signal receiving wire 74. In step S04, the demodulation unit 132 applies demodulation processing corresponding to modulation processing for generating the test signal modulated wave to the test signal received wave to extract the received test signal.

Subsequently, the cable deterioration diagnosis device 100 executes steps S05 and S06. In step S05, the deterioration detection unit 113 calculates the amount of fluctuation in the difference between the intensity of the test signal and the intensity of the received test signal. In step S06, the deterioration detection unit 113 checks whether the amount of fluctuation exceeds the deterioration detection level.

In step S06, when the amount of fluctuation is determined not to reach the deterioration detection level, the cable deterioration diagnosis device 100 returns the processing to step S03. In step S06, when the amount of fluctuation is determined to exceed the deterioration detection level, the cable deterioration diagnosis device 100 executes steps S07 and S08. In step S07, the data accumulation unit 142 accumulates, in the database 143, a fluctuation record in which a value of the amount of fluctuation is associated with a time. In step S08, the distribution data generation unit 146 generates the frequency distribution data representing the frequency for each of the plurality of bands based on the fluctuation records accumulated in the database 143. The generated frequency distribution data is accumulated in the database 143 by the data accumulation unit 142.

Subsequently, the cable deterioration diagnosis device 100 executes steps S09 and S11. In step S09, the residual life estimation unit 144 inputs the frequency distribution data into the life prediction model 148 to calculate the estimated value of the residual life. The residual life estimation unit 144 may input two or more frequency distribution data in time series into the life prediction model 148 to calculate the estimated value of the residual life. In step S11, the notification unit 147 checks whether the estimated value of the residual life is below the notification level.

In step S11, when the estimated value of the residual life is determined to be above the notification level, the cable deterioration diagnosis device 100 returns the processing to step S03. In step S11, when the estimated value of the residual life is determined to be below the notification level, the cable deterioration diagnosis device 100 executes step S12. In step S12, the notification unit 147 displays the warning indication on the display device 198. The cable deterioration diagnosis device 100 then returns the processing to step S03. The cable deterioration diagnosis device 100 repeats steps S03 to S12.

Figure 8:
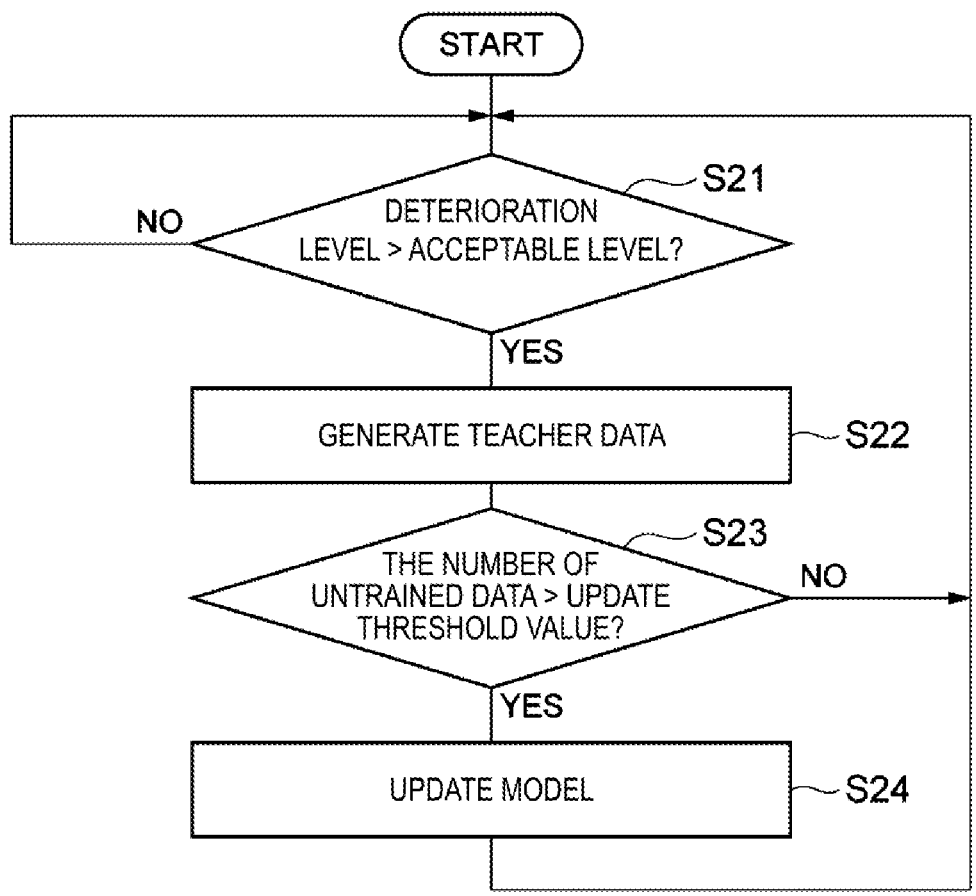
FIG. 8 is a flowchart illustrating a model update procedure.

As described above, the cable deterioration diagnosis device 100 may be configured to update the life prediction model 148 based on the data accumulated in the database 143 when the deterioration level exceeds the acceptable level. FIG. 8 is a flowchart illustrating a procedure for updating the life prediction model 148. This procedure is executed simultaneously with the cable deterioration diagnosis procedure described above.

As illustrated in FIG. 8, the cable deterioration diagnosis device 100 executes steps S21 and S22. In step S21, the life detection unit 151 waits for the deterioration level of the cable 70 to exceed the acceptable level. In step S22, the teacher data generation unit 152 generates the teacher data representing the relationship between the two or more frequency distribution data and the estimated value of the residual life. The generated teacher data is accumulated in the database 143 by the data accumulation unit 142.

Subsequently, the cable deterioration diagnosis device 100 executes step S23. In step S23, the model update unit 153 checks whether the number of untrained teacher data accumulated in the database 143 exceeds a predetermined update threshold value. The term "untrained teacher data" means teacher data that has not yet been used for updating the life prediction model 148.

In step S23, when the number of untrained teacher data is determined not to reach the update threshold value, the cable deterioration diagnosis device 100 returns the processing to step S21. In step S23, the number of untrained teacher data is determined to exceed the update threshold value, the cable deterioration diagnosis device 100 executes step S24. In step S24, the model update unit 153 updates the life prediction model 148 by machine learning based on the teacher data accumulated in the database 143, and stores the updated life prediction model 148 in the model holding unit 145. The cable deterioration diagnosis device 100 then returns the processing to step S21. The cable deterioration diagnosis device 100 repeats the above processing.

As described above, the cable deterioration diagnosis device 100 is a device for diagnosing the deterioration of the cable 70 having the plurality of electrical wires including the one or more signal wires 72 that transmit signals between the first device 2 and the second device 3, and includes the test signal output unit 111 that outputs the wave-like test signal to the test signal transmitting wire 73 independent of the one or more signal wires 72 among the plurality of electrical wires, the test signal extraction unit 112 that extracts the received test signal corresponding to the test signal from the signal propagated in the test signal receiving wire 74 independent of the one or more signal wires 72 and the test signal transmitting wire 73 among the plurality of electrical wires, and the deterioration detection unit 113 that detects the deterioration of the cable 70 based on the test signal and the received test signal.

According to the method of adding the high-frequency pulse to the signal wires 72 themselves, which are the targets of deterioration detection, it is necessary to inject the high-frequency pulse into each of the plurality of signal wires 72 in order to detect the deterioration in the plurality of signal wires 72. In contrast, according to the cable deterioration diagnosis device 100, the deterioration of the cable 70 can be detected based on the test signal output to the single test signal transmitting wire 73 and the received test signal propagated in the single test signal receiving wire 74, regardless of the number of signal wires 72. Therefore, it is effective in detecting the deterioration of the cable 70 with a simpler configuration.

The deterioration detection unit 113 may detect the deterioration of the cable 70 when the amount of fluctuation in the difference between the intensity of the test signal and the intensity of the received test signal exceeds the predetermined deterioration detection level. In this case, the deterioration of the cable 70 can be detected with high reliability by appropriately setting the deterioration detection level.

The test signal output unit 111 may output the test signal modulated wave, in which the test signal is superimposed on the carrier wave, to the test signal transmitting wire 73, and the test signal extraction unit 112 may extract the test signal received wave corresponding to the test signal modulated wave from the signal propagated in the test signal receiving wire 74, and may extract the received test signal from the test signal received wave. In this case, the received test signal can be extracted with higher reliability by superimposing the test signal on the carrier wave.

The test signal output unit 111 may output the test signal modulated wave to the test signal transmitting wire 73 in which the test signal is superimposed on the carrier wave having the frequency different from the frequency of the signals transmitted by the one or more signal wires 72. In this case, the received test signal can be extracted with higher reliability by appropriately setting the frequency of the carrier wave.

The cable deterioration diagnosis device 100 may further include the residual life estimation unit 144 that calculates the estimated value of the residual life representing the length of the period of time until the deterioration level of the cable 70 exceeds the acceptable level, based on the frequency at which the amount of fluctuation exceeds the deterioration detection level. There is a correlation between the frequency and the estimated value of the residual life. Therefore, the estimated value of the residual life can be calculated with high reliability based on the frequency.

The cable deterioration diagnosis device 100 may further include the residual life estimation unit 144 that calculates the estimated value of the residual life representing the length of the period of time until the deterioration level of the cable 70 exceeds the acceptable level, based on the amount of fluctuation. There is a correlation between the amount of fluctuation and the estimated value of the residual life. Therefore, the estimated value of the residual life can be calculated with high reliability based on the amount of fluctuation.

The cable deterioration diagnosis device 100 may further include the distribution data generation unit 146 that generates the frequency distribution data representing the frequency of the amount of fluctuation for each of the plurality of bands, and the residual life estimation unit 144 that calculates the estimated value of the residual life representing the length of the period of time until the deterioration level of the cable 70 exceeds the acceptable level based on the frequency distribution data. Based on the frequency of the amount of fluctuation for each band, the estimated value of the residual life can be calculated with higher reliability.

The residual life estimation unit 144 may calculate the estimated value of the residual life based on the two or more frequency distribution data in time series. Further based on the temporal change of the frequency distribution data, the estimated value of the residual life can be calculated with higher reliability.

The residual life estimation unit 144 may calculate the estimated value of the residual life based on the two or more frequency distribution data in time series and the life prediction model that outputs the estimated value of the residual life in response to the two or more frequency distribution data inputs in time series. Further based on the temporal change of the frequency distribution data, the estimated value of the residual life can be calculated with higher reliability.

The cable deterioration diagnosis device 100 may further include the data accumulation unit 142 that accumulates the frequency distribution data in the database 143 in time series, the teacher data generation unit 152 that generates the teacher data representing the relationship between the two or more frequency distribution data and the estimated value of the residual life based on data accumulated in the database 143 when the deterioration level exceeds the acceptable level, and the model update unit 153 that updates the life prediction model by machine learning based on the teacher data. In this case, by updating the life estimation model based on the measured value of the residual life, the reliability of the estimated value of the residual life calculated based on the life prediction model can be further improved.

The cable deterioration diagnosis device 100 may further include the notification unit 147 that notifies that the estimated value of the residual life has reached the predetermined notification level. In this case, the deterioration of the cable 70 can be notified at a more appropriate timing.

The cable deterioration diagnosis device 100 may include the main body 101 having the test signal output unit 111, the test signal extraction unit 112, and the deterioration detection unit 113, and the adapter 200 that connects the signal wire 72 to the first device 2 and connects the test signal transmitting wire 73 and the test signal receiving wire 74 to the main body 101. In this case, the cable deterioration diagnosis device 100 can be easily inserted between the first device 2 and the cable 70.

The machine system 1 includes the cable deterioration diagnosis device 100, the first device 2, the second device 3, and the cable 70, and the second device 3 has the movable unit 4 that operates while bending the cable 70. Since the cable deterioration diagnosis device 100 is applied to the machine system 1 in which the cable 70 is bent, it is more beneficial to be able to detect the deterioration of the cable 70 with a simpler configuration. Note that, according to the cable deterioration diagnosis device 100, the cable deterioration caused by, for example, an object external to the machine system 1 coming into contact with the cable 70 can also be detected. Therefore, it is also applicable to a system that does not include the movable unit 4 that operates while bending the cable 70.

The second device 3 may be a robot having the plurality of joints 41, 42, 43, 44, 45, and 46 as the movable unit 4. Since the cable deterioration diagnosis device 100 is applied to the robot in which the cable 70 is bent more frequently, it is more beneficial to be able to detect the deterioration of the cable 70 with a simpler configuration.

The embodiment has been described above. However, the present invention is not necessarily limited to the embodiment described above, and various modifications are possible without departing from the gist of the present invention.

REFERENCE SIGNS LIST

1 Machine system
2 First device
3 Second device
4 Movable unit
41, 42, 43, 44, 45, 46 Joint
70 Cable
72 Signal wire
73 Test signal transmitting wire
74 Test signal receiving wire
100 Cable deterioration diagnosis device
101 Main body
111 Test signal output unit
112 Test signal extraction unit
113 Deterioration detection unit
200 Adapter
142 Data accumulation unit 143 Database
144 Residual life estimation unit
146 Distribution data generation unit
147 Notification unit
152 Teacher data generation unit
153 Model update unit

The invention claimed is:

1. A cable deterioration diagnosis device configured to diagnose deterioration of a cable having a plurality of electrical wires including one or more signal wires configured to transmit signals between a first device and a second device, the cable deterioration diagnosis device comprising:
   a test signal output unit configured to output a test signal having a wavelike shape to a test signal transmitting wire, the test signal transmitting wire being independent of the one or more signal wires among the plurality of electrical wires;
   a test signal extraction unit configured to extract a received test signal corresponding to the test signal from a signal propagated in a test signal receiving wire, the test signal receiving wire being independent of the one or more signal wires and the test signal transmitting wire among the plurality of electrical wires; and
   a deterioration detection unit configured to detect deterioration of the cable based on the test signal and the received test signal,
   wherein the deterioration detection unit detects the deterioration of the cable when an amount of fluctuation in a difference between intensity of the test signal and intensity of the received test signal exceeds a predetermined deterioration detection level,
   wherein the test signal output unit outputs a test signal modulated wave, in which the test signal is superimposed on a carrier wave, to the test signal transmitting wire; and,
   the test signal extraction unit extracts a test signal received wave corresponding to the test signal modulated wave from the signal propagated in the test signal receiving wire, and extracts the received test signal from the test signal received wave.

2. The cable deterioration diagnosis device according to claim 1, wherein the test signal output unit outputs the test signal modulated wave, in which the test signal is superimposed on the carrier wave having a frequency different from a frequency of the signals transmitted by the one or more signal wires, to the test signal transmitting wire.

3. The cable deterioration diagnosis device according to claim 1, further comprising a residual life estimation unit configured to calculate an estimated value of a residual life representing a length of a period of time until the deterioration level of the cable exceeds an acceptable level, based on a frequency at which the amount of fluctuation exceeds the deterioration detection level.

4. The cable deterioration diagnosis device according to claim 1, further comprising a residual life estimation unit configured to calculate an estimated value of a residual life representing a length of a period of time until the deterioration level of the cable exceeds an acceptable level, based on the amount of fluctuation.

5. The cable deterioration diagnosis device according to claim 1, further comprising:
   a distribution data generation unit configured to generate frequency distribution data representing a frequency of the amount of fluctuation for each of a plurality of bands; and
   a residual life estimation unit configured to calculate an estimated value of a residual life representing a length of a period of time until the deterioration level of the cable exceeds an acceptable level, based on the frequency distribution data.

6. The cable deterioration diagnosis device according to claim 5, wherein the residual life estimation unit calculates the estimated value of the residual life based on a plurality of the frequency distribution data in time series.

7. The cable deterioration diagnosis device according to claim 6, wherein the residual life estimation unit calculates the estimated value of the residual life based on a plurality of the frequency distribution data in time series and a life prediction model outputting the estimated value of the residual life in response to inputs of a plurality of the frequency distribution data in time series.

8. The cable deterioration diagnosis device according to claim 7, further comprising:
   a data accumulation unit configured to accumulate the frequency distribution data in a database in time series;
   a teacher data generation unit configured to generate teacher data representing a relationship between the plurality of the frequency distribution data and the estimated value of the residual life based on the data accumulated in the database when the deterioration level exceeds the acceptable level; and
   a model update unit configured to update the life prediction model by machine learning based on the teacher data.

9. The cable deterioration diagnosis device according to claim 3, further comprising a notification unit configured to notify that the estimated value of the residual life has reached a predetermined notification level.

10. The cable deterioration diagnosis device according to claim 1, further comprising:
    a main body having the test signal output unit, the test signal extraction unit, and the deterioration detection unit; and
    an adapter configured to connect the one or more signal wires to the first device and connect the test signal transmitting wire and the test signal receiving wire to the main body.

11. A machine system, comprising:
    the cable deterioration diagnosis device according to claim 1;
    the first device;
    the second device; and
    the cable, wherein
    the second device has a movable unit configured to operate while bending the cable.

12. The machine system according to claim 11, wherein the second device is a robot having a plurality of joints as the movable unit.

13. A method of diagnosing deterioration of a cable having a plurality of electrical wires including one or more signal wires configured to transmit signals between a first device and a second device, the method comprising:
    outputting a test signal having a wavelike shape to a test signal transmitting wire, the test signal transmitting wire being independent of the one or more signal wires among the plurality of electrical wires;
    extracting a received test signal corresponding to the test signal from a signal propagated in a test signal receiving wire, the test signal receiving wire being independent of the one or more signal wires and the test signal transmitting wire among the plurality of electrical wires;
    detecting deterioration of the cable based on the test signal and the received test signal via a fluctuation in a difference between an intensity of the test signal and an intensity of the received test signal which exceeds a predetermined deterioration detection level;

outputting a test signal modulated wave, in which the test signal is superimposed on a carrier wave, to the test signal transmitting wire;

extracting a test signal received wave corresponding to the test signal modulated wave from the signal propagated in the test signal receiving wire; and, extracting the received test signal from the test signal received wave.

\* \* \* \* \*